United States Patent [19]
Allina

[11] Patent Number: 5,774,317
[45] Date of Patent: Jun. 30, 1998

[54] PLUG-THROUGH TRANSIENT VOLTAGE SURGE SUPPRESSION

[75] Inventor: Edward F. Allina, Treasure Island, Fla.

[73] Assignee: Stanley F. Allina, Jr., Lake Park, Fla.

[21] Appl. No.: 14,379

[22] Filed: Feb. 5, 1993

Related U.S. Application Data

[63] Continuation-in-part of Ser. No. 479,856, Feb. 14, 1990, abandoned, which is a continuation-in-part of Ser. No. 923,524, Oct. 28, 1996, Pat. No. 4,931,895.

[51] Int. Cl.$^6$ ........................................................ H02H 9/00
[52] U.S. Cl. ................................. 361/56; 361/111; 361/91
[58] Field of Search .................................. 361/111, 117, 361/126, 127, 56, 366, 400, 405, 372

[56] References Cited

U.S. PATENT DOCUMENTS

| | | | |
|---|---|---|---|
| 2,606,232 | 8/1952 | St. John | 361/661 |
| 3,725,745 | 4/1973 | Zisa | 317/104 |
| 3,914,657 | 10/1975 | Melanson | 317/61.5 |
| 4,089,032 | 5/1978 | Dell Orfano | 361/56 |
| 4,726,638 | 2/1988 | Farrar et al. | 439/620 R |
| 4,875,137 | 10/1989 | Rozanski et al. | 361/331 |
| 5,010,438 | 4/1991 | Brady | 361/56 |

*Primary Examiner*—Jeffrey A. Gaffin
*Assistant Examiner*—Sally C. Medley
*Attorney, Agent, or Firm*—Charles A. McClure

[57] ABSTRACT

Plug-through electrical transient voltage surge suppression for watt-hour meters and downstream electrical equipment. A circuit board is configured to fit about the power terminals of such a meter and are supported by the terminals or by a plug-and-jack adapter interposed between the meter and its socket in a grounded utility box or panel. The circuit board conveniently and effectively connects a plurality of varistors between the power terminals and an external ground, enabling the varistors to clip voltage surges unassisted and to shunt resulting surge currents to ground, thereby protecting both the meter and powered downstream electrical equipment from possible surge damage. Each varistor is preferably sandwiched contiguously between the grounding plate and respective powered conductive surface layers on the board, or the varistors may be mounted on pairs of leads connected between ground and powered leads and preferably bendable to parallel the varistors to the board and grounding plate.

10 Claims, 2 Drawing Sheets

U.S. Patent      Jun. 30, 1998      Sheet 1 of 2      5,774,317
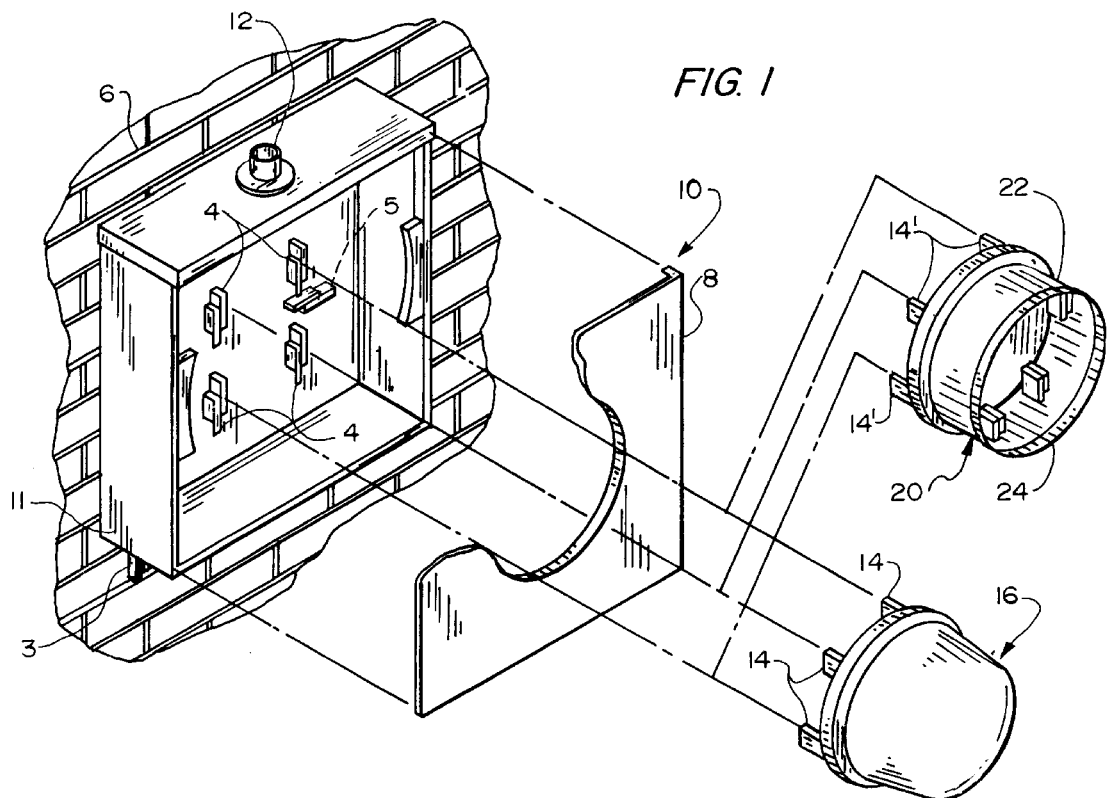
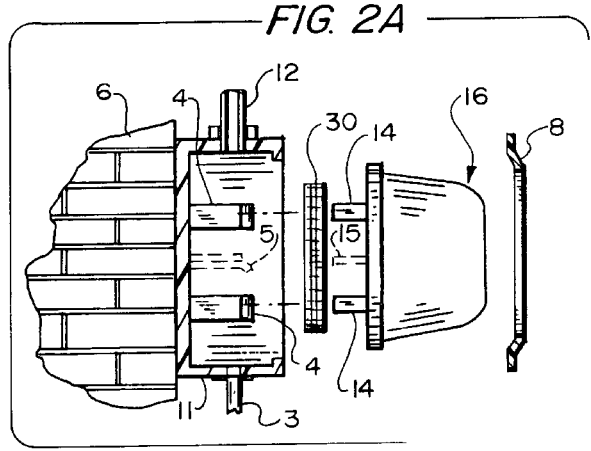
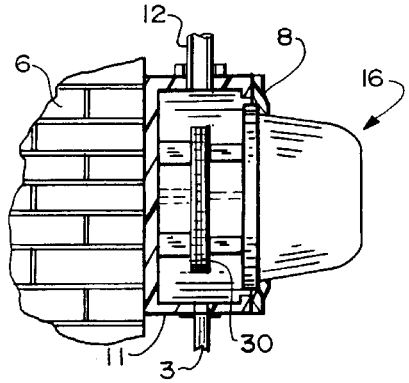
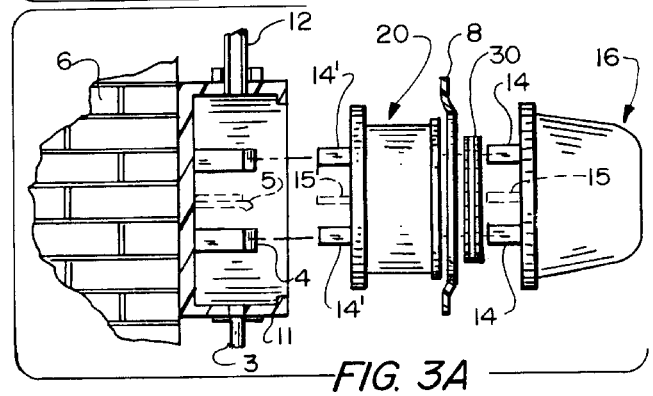
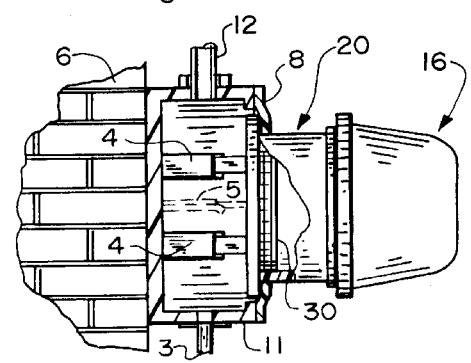

5,774,317

PLUG-THROUGH TRANSIENT VOLTAGE SURGE SUPPRESSION

This is a continuation-in-part of my patent application Ser. No. 479,856 filed Feb. 14, 1990, now abandoned, itself a continuation-in-part of Ser. No. 923,524 filed Oct. 28, 1986, and now U.S. Pat. No. 4,931,895.

TECHNICAL FIELD

This invention relates to electrical transient voltage surge suppression (TVSS) by circuitry, including varistors, supported between a watt-hour meter and its socket in a utility box or panel.

BACKGROUND OF THE INVENTION

Electrical power supplied by public or private utilities is susceptible to transient voltage variations attributable to lightning strikes and/or switching malfunctions. Customers traditionally have borne the brunt of transient surges, and had their light bulbs and motor windings fail ("burn out") from time to time as a result. However, that is no longer acceptable in an age of solid-state electronic devices, which often may be damaged worse by smaller surges than their appliance motors or radios withstood in the past. The desirability of protecting utility meters and downstream electrical equipment from voltage surges is obvious, and customers expect to receive such protection. Indeed, regulatory agencies and the courts are imposing upon public utilities an obligation to assure suitability of product/service as delivered rather than resorting to a force majeure or "act of God" concept to excuse preventable damage to a customer's equipment or installation.

Accordingly, electrical utilities are now having to exercise more quality control over their product/service, to render it truly merchantable for modern-day uses—or be potentially liable, in the event of surge damage, for not doing so. As in other instances of readily available safety measures, insurance companies are able to foster adoption of transient voltage surge suppression, by providing more favorable rates where TVSS has been installed.

Conventional watt-hour meters are commonly connected between an external power source and electrical equipment downstream, so as to measure the amount of electrical energy or power utilized by the downstream equipment. Such meters have as contactors protruding blade-like terminals that plug into a socket connected to power-line leads at a utility box or panel, as at a power customer's location.

As suggested by the present inventor in 1986, in the earliest of his aforementioned patent applications, the vicinity of the watt hour meter is now the preferred site for transient voltage surge suppression, at least in the instance of households and commercial or other installations at the normal household voltage and with the usual downstream electrical equipment powered at such voltage.

For many decades electrical utility personnel have known that switches and other circuit-interruption devices can be installed in a cylindrical housing, now known as a meter adapter, for plug-and-jack interposition between a watt-hour meter and its socket, as was pointed out in the present inventor's earliest patent application by reference to patents granted to St. John and Megarian, for example.

St. John in U.S. Pat. No. 2,606,232 (1952) disclosed interposable adapter means providing for circuit-interruption, by manual switch at will, and by circuit breaker and/or fuse in the event of current overload of such amount and duration as to provoke an interruption. St. John's objectives were to free authorized personnel from having to enter the premises serviced by the power lines in order to shut off the power and/or to replace fuses or service circuit breakers. St. John's arrangement left the meter connected to the power lines despite interruption of the downstream circuit for any reason, so it did not protect the meter itself against transients on power lines.

Megarian in U.S. Pat. No. 3,599,047 (1971) elaborated upon manual switching, including disconnecting the watt-hour meter from the line power when the downstream circuit was not to be enabled. When the line power was shut off, Megarian's arrangement protected the meter as well as the downstream electrical equipment—but both the meter and the downstream equipment remained susceptible to damage from a transient voltage surge received via the power lines when connected.

Neither St. John's nor Megarian's arrangement provided any TVSS protection, not only because obviously manual switches cannot do so, but also because over-current devices, such as fuses or circuit breakers, even when connected, are not actuated by fractional-second transient surges but only by current overloads of appreciably longer duration—and after actuation must be replaced or reset. As already noted, even St. John's fuses and circuit breakers were not connected in the circuit to the watt-hour meter so could not even protect it against a protracted current overload sufficient to actuate a fuse or a circuit breaker.

Protection against over-voltage, as distinct from protection against over-current conditions (such as a current overload), calls for completely different electrical means. The archetype of such means is a spark gap. Spark gaps have been used for years on power lines, but open-air spark gaps are erratic in their action and are unsafe for use at a customer's premises, whereas analogous gaps in gas-filled envelopes lack adequate response time to cope with transient surges received from power lines.

A watt-hour meter has a predictably long life, even a quarter century if protected against excessive voltages and currents. Some workers in the art undertook to provide such meters with protection against damaging voltage transients as well as current overloads.

A spark gap undergoes no electrical conduction until a large enough voltage differential builds up across its terminals between power line and ground to cause an arc between them, whereupon the spark gap clips the voltage transient and conducts the resulting surge current to the external ground. The required voltage differential is a function of gap size, terminal shape, intervening gas(es), gas pressure, and humidity. The voltage drop across a conducting arc is much smaller than the voltage required to initiate or "strike" such arc. Once struck, an arc may become self-sustaining or at least difficult to extinguish, as current "follows on" through the resulting low-impedance gap filled with already ionized air. A standard remedy was insertion of a high-resistance, in series with the spark gap, as via a Nichrome wire. At the low voltage present at watt-hour locations, a high series resistance tended to prevent the spark gap from striking so as to clip intermediate-level voltage surges hazardous to meters and to shunt resulting current to ground.

Workers in the art attacked this problem by substituting a variable-resistance means for the fixed-resistance Nichrome wire in series with the spark gap. Zisa in U.S. Pat. No. 3,725,745 (1973), and Melanson in U.S. Pat. No. 3,914,657 (1975), connected solid-state variable-resistance devices between power lines and the spark gaps. The function of such a device (characterized by inverse relationship between its resistance and applied voltage) was to conduct readily whenever the voltage surged so high that the spark gap would conduct but to discontinue conducting at the lower follow-on voltage so as to extinguish the arc promptly upon cessation of the voltage surge. Although similar arrangements were adopted for power lines at higher voltages, they were not adopted at the usual watt-hour locations.

Other workers, such as Dell Orfano in U.S. Pat. No. 4,089,032 (1978), adopted "varistors" (a class of such solid-state devices) for over-voltage protective apparatus adapted to be plugged into electrical wall outlets upstream of whatever is to be operated by electricity drawn from such outlets. Such protective apparatus may contain additional components, such as glow tubes or diodes, but at least in the absence of such added components, the varistors operate to clip voltage surges at a given level above normal power voltage and shunt their surge currents away (usually to ground) before reaching the downstream equipment. In this regard a varistor selected to conduct minimally at normal power voltage has taken on the primary function (formerly performed by a spark gap) of clipping the surge above a preselected higher voltage, and a modified function of minimal conduction (substantial non-conduction) at power voltages.

Notwithstanding the two decades between St. John's meter adapter and the aforementioned 1970's patents, no one then or in the decade of the 1980's provided a meter adapter with built-in TVSS until the present inventor first did so in the mid-1980's.

Despite the well recognized need for transient voltage surge protection, the resulting meter-based TVSS revolution, now under way was impossible to foresee. For whatever reasons, the art was stagnant, and the contributions of inventors noted above had not given rise to the present methods or apparatus. Once the present inventor had shown the way, entry into the field occurred so rapidly as to underscore the unlikelihood that the prior art would have provided such contributions to this surge-suppression art unaided.

The steps of installing a TVSS meter adapter could hardly be much simpler. The installer first unplugs the watt-hour meter from its socket in the customary utility box or panel, then plugs the adapter (in place of the meter) into the socket, and finally plugs the meter into the meter adapter as the meter had been previously plugged into the socket. Installation requires only a few minutes.

Producing an effective TVSS meter adapter is quite difficult because of the extreme conditions imposed upon the apparatus by the transient surges. In view of the very high, but quite short, voltage surges and the very large resulting surge currents, testing sites for apparatus of this general type have been severely limited (and testing costly) so that in most instances it is impracticable for users to test competing equipment or to verify (or disprove) operating specifications or technical claims of suppliers.

Competing manufacturers, whether they have or have not actually tested their products under surge voltages and resulting currents, overwhelmingly have adopted the meter adapter as the preferred means of housing varistors connected to provide TVSS at the watt-hour meter location. Competitors also have included, with noteworthy alacrity, various improvements—whether patented or not—provided by the present inventor, who has pioneered increased surge capacity and safety of surge-protective apparatus.

Examples of TVSS improvements by the present inventor include ground-plane heat-sinking of component varistors (see his aforementioned patent); inserting temperature-responsive or "thermal" fuses or like cutoff devices to sense temperature and to disconnect the varistors from the power lines to preclude failure from excessive temperature rise (as in U.S. Pat. No. 4,866,560); stacking varistor disks in parallel circuit (in U.S. Pat. Nos. 4,901,187, 5,006,950, and 5,148,345); and improved plug-and-jack connectors (as in U.S. Pat. Nos. 4,944,692 and 5,129,841). Other examples of his TVSS contributions have focused upon a hard-wired unit, including distributed-resistance fuse links, with or without thermal cutoff means and/or varistor stacking, between power line leads and varistors (as in U.S. Pat. Nos. 4,907,119 and 5,148,345); and are extinguishing (as in U.S. Pat. No. 5,140,491).

SUMMARY OF THE INVENTION

A primary object of the present invention is to provide surge protection as conveniently as a watt-hour meter can be unplugged and then be plugged in again, whether into a meter adapter or socket.

Another object of this invention is to provide surge protection on a circuit board into and through which a watt-hour meter or meter adapter can plug as easily as the meter plugs into its usual socket.

A further object of the invention is to support TVSS varistors and other circuitry independently without need for a meter adapter.

Yet another object of the present invention is to enclose TVSS circuitry laterally within the utility box or panel and to cover it by plugging the meter into its socket in the absence of an adapter.

A still further object of this invention is to complete contact with surge-suppression means on a circuit board by one-step plugging of blade means of a meter adapter or only the meter itself into the usual socket in a utility box or panel into which it normally plugs.

An additional object is to provide circuit boards with sidewise engaging contactors for putting surge-suppression means in circuit.

A still further object is to render surge protection or surge suppression more economical to adopt when provided as aforesaid.

In general, the objects of the present invention are attained by providing transient voltage surge suppression on means supported between a watt-hour meter and its socket to protect both the meter and electrical equipment downstream from it, with or without an added meter adapter housing, interposed in plug-and-jack manner between the meter and its socket. In the absence of an independently supported adapter housing the TVSS means, including a circuit board, admits the meter blades and is supported via lateral contact therewith. The utility box or panel is then covered by the meter to the extent not already covered by its customary cover.

More particularly, varistors or equivalent transient voltage surge-suppression means are preferably supported on a circuit board adapted to have watt-hour meter blades or prongs pass by or through it and thereupon contact sidewise flexing contactors on the circuit board to connect the surge-suppression means between the external power source and an external ground—to which surges are shunted.

The varistors may lie flat against a surface mount on the board and be overlain by a ground plane with heat sink characteristics, or be mounted in lollipop fashion on leads upstanding from the board or optionally bent to parallel the varistors to the board.

Other objects of this invention, together with means and methods for attaining the various objects, will be apparent from the following description and the accompanying diagrams, which are presented by way of example rather than limitation.

SUMMARY OF THE DRAWINGS

FIG. 1 is an exploded perspective view of a watt-hour meter and socket means into which the meter normally plugs, plus interposable plug-in adapter housing means (shown offset from the plug-in axis);

FIGS. 2A and 2B are, respectively, exploded and assembled side elevations, partly sectioned away, of the socket means and the watt-hour meter of the preceding view, with circuit board means of this invention interposed therebetween;

FIG. 3A and 3B are, respectively exploded and assembled side elevations, partly sectioned away, of the socket means and meter, with the adapter housing means of FIG. 1 interposed therebetween, and with circuit board means of this invention interposed between the meter its socket means and surrounded by the adapter means;

DESCRIPTION OF THE INVENTION

Figure 4:
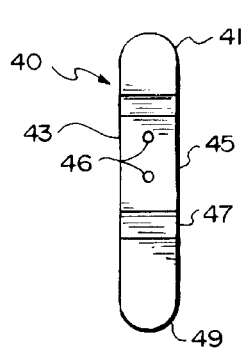
FIGS. 4 and 5 are, respectively front and side elevations of ground plane means useful according to this invention.

FIG. 1 shows, in horizontally exploded perspective, electrical apparatus 10 featuring utility box or panel 11 rear-mounted on brick wall 6, having open fitting 12 at its top to admit external electrical power input leads (not shown), and grounded by external cable 3 (underneath). The panel supports at least a quartet of conducting jaws 4 in socket configuration inside, the upper pair usually being connected to the power input leads. The panel is uncovered at the front to receive in the socket jaws a complementary set of blades 14 protruding from the base of watt-hour meter 16. The customary meter face is oppositely directed and is transparent to enable reading of an electrical power consumption indicator located just inside it.

In dashed lines at a quarter turn axially, optional fifth jaw 5 appears between jaws 4 inside the panel—positioned to be opposite an optional fifth blade to be plugged therein (not visible here). This optional fifth jaw may be used for auxiliary grounding or for a third power terminal, as in network operation. Grounding use is specifically considered below.

Cover 8 (shown partly cut away in FIG. 1)) fits about the meter housing—and when closed over the panel covers the surrounding part of the panel front. It will be understood that when the meter is in place, with its blades plugged into the socket jaws, the meter fits against the rim surrounding the central opening in the cover. Not shown is the customary split ring (with seal) fitting about the rim of the cover and the rim of either the meter or an adapter housing, mainly as a security device to preclude unauthorized unplugging and possible tampering with the meter.

Located at the upper right in FIG. 1 is meter adapter 20, laterally offset from the meter-to-socket axis. As suggested by the zigzag intermittently broken lines, adapter 20 is interposable onto such axis between meter 16 and utility box or panel 11. Meter adapter 20 has cylindrical housing 22, with an open end surrounding socket jaws 24 (corresponding to panel jaws 4) adapted to accommodate blades 14 plugged thereinto from the meter when the adapter is so interposed. Protruding from the closed opposite end of meter adapter 20 in FIG. 1 are blades 14' corresponding to meter blades 14 and adapted to plug similarly into the panel socket jaws.

It is apparent, therefore, that FIG. 1 teaches two alternative embodiments of the addition of a circuit board with surge-protective components in close proximity to the meter—one with, and the other without—a plug-and-jack adapter interposed between the meter and the utility box or panel. The next views show the TVSS means in each of these embodiments.

FIG. 2A shows, in exploded side elevation, utility box or panel 11 rear-mounted on wall 6 and containing socket jaws 4 in line to receive blades 14 of meter 16. Interposed between the meter and the panel socket is circuit board means 30 of this invention, here shown in laminated form but without circuitry details visible. As will be shown later, the circuit board means is adapted to accommodate the blades and to make contact therewith to energize its circuitry. To the right of the meter is cover 8 for the utility box or panel, with a central opening to accommodate the meter in a close fit therewith.

FIG. 2B shows the FIG. 2A components assembled in otherwise similar side elevation. As is apparent from this normally closed position, adequate space remains between the base of the meter and the back wall of the box or panel to accommodate circuit board 30 with reasonably compact TVSS components. As shown in details of a preferred embodiment considered below, the TVSS circuit board is supported conveniently on protruding meter blades 14 apart from the meter housing and without need for auxiliary support. However, more support may be provided as an option, as shown for example in the so-called meter adapter embodiment shown in the next pair of views.

FIG. 3A shows, in exploded side elevation, all the components of the preceding views, plus meter adapter housing 20 of FIG. 1, as interposed between panel 11 and circuit board means 30 of this invention. Adapter blades 14' are in line to plug into panel socket jaws 4. The adapter jaws are hidden from view inside the right portion of adapter housing 22 in like socket configuration to receive blades 14 protruding (leftward) from watt-hour meter 16.

FIG. 3B shows the FIG. 3A components assembled in similar side elevation, with meter 16 plugged into meter adapter 20, and with the corresponding blades (14') of the adapter plugged into jaws 4 of the socket in utility box or panel 11. Circuit board 30 (dashed lines) is supported inside the left part of the adapter housing.

Figure 5:
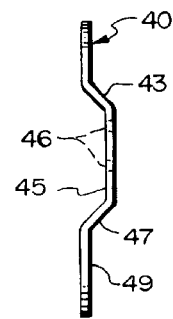

FIGS. 4 and 5 show grounding plate 40, respectively face-on and from the side, larger in scale than the preceding Figs. but smaller than the scale of later Figs. Aligned relatively short end portion 41 and longer opposite end portion 49 are offset from and parallel to central portion 45, and are joined thereto by oblique intermediate portions 43 and 47. Pair of openings 46 through central portion 45 are spaced apart in the plate's lengthwise direction to receive fastener means (not shown).

Figure 6:
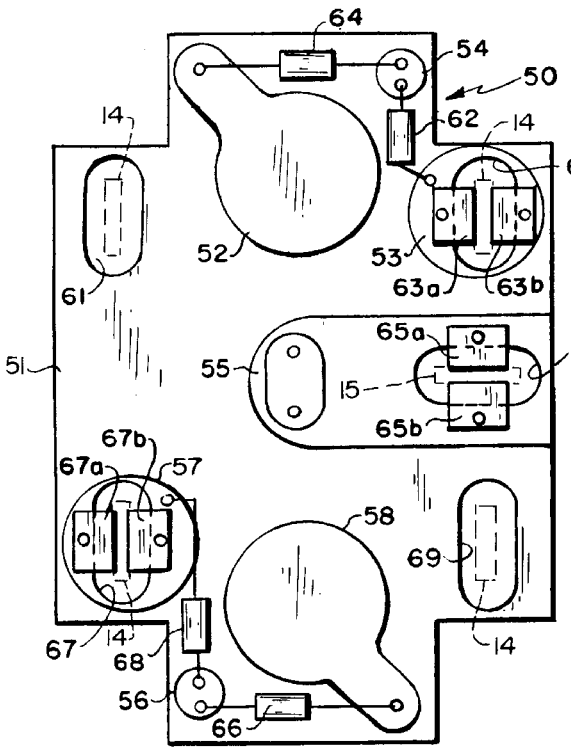
FIG. 6 is a schematic front elevation of one embodiment of circuit board means of this invention less associated varistors.
Figure 7:
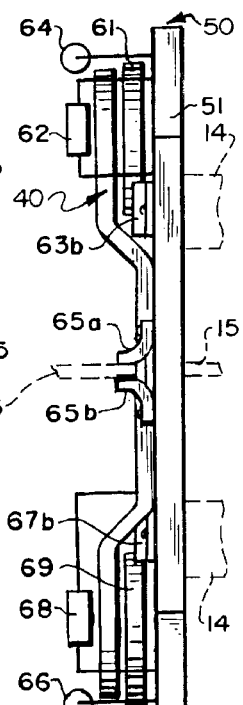
FIG. 7 is a schematic side elevation of the circuit board means of FIGS. 2 and 3 and the ground plane means of FIGS. 4 and 5, assembled with varistors in place therebetween contiguous therewith.

FIGS. 6 and 7 show first embodiment, 50, of circuit board means of this invention face-on and from the side, respectively. Included is board 51, generally rectangular but with indentations at its corners, and conductively plated with pair of conductive keyhole-shaped surface portions 52, 58 at upper and lower center, pair of smaller circular surface portions 53, 57 at upper right and lower left; and central tongue portion 55 from the board's right edge to its center.

Racetrack-shaped blade-receiving slots 61, 63, 67, 69 through the board with their long axis vertical and aligned with the cutouts are within the four laterally outermost corners, two of them (63, 67) within the respective circular conductive surfaces. Similar fifth slot 65 midway between the slots at the right edge within the right part of the central conductive surface and oriented with its axis horizontal is adapted to receive optional fifth blade 15' (dashed lines) as for supplementary grounding or other connection. Slots 61 and 69 are adapted to receive conductive blades (dashed lines) 14' without touching them, whereas the slots through the conductive surface portions are bridged by pairs of flexible contacts (63a, 63b; 65a, 65b; 67a, 67b) to engage and be energized by inserted blades 14 (dashed lines). Pair of small circular tiepoint surfaces 54, 56 are at the upper right and lower left, respectively.

Current-limiting fuse 64 is connected between contacting surface 52 and tiepoint 54, while identical current-limiting fuse 66 is connected between tiepoint 56 and conductive surface 58. These have the usual function of preventing a sustained current overload, such as may arise from a short circuit in electrical apparatus.

Temperature-sensitive or "thermal" (not current-limited) cutoff means 62 connects from conductive surface 53 to tiepoint 54, and like means 68 connects between conductive surface 57 and tiepoint 56, with a totally dissimilar function of opening the circuit to the varistors at a temperature approaching but below the temperature at which the physical integrity of the varistors might suffer—as might be occasioned by abnormally frequent surges through the varistors.

FIG. 7 shows grounding plate 40 of FIGS. 4 and 5 assembled to circuit board means 50 of FIG. 6 with varistor 61 sandwiched between the offset upper end of the plate and conductive surface portion 52 on board 51, and with varistor 69 likewise between the offset lower end of the overlying plate and the underlying conductive surface portion of the board. It will be understood that one face of each disklike varistor is in conductive contact with the grounding plate, and the opposite face is similarly in contact with a conductive surface portion on the circuit board energized from the conductive blades (when present) through the flexible contacts and series connections with the circular conductive surfaces and the fuses.

Figure 8:
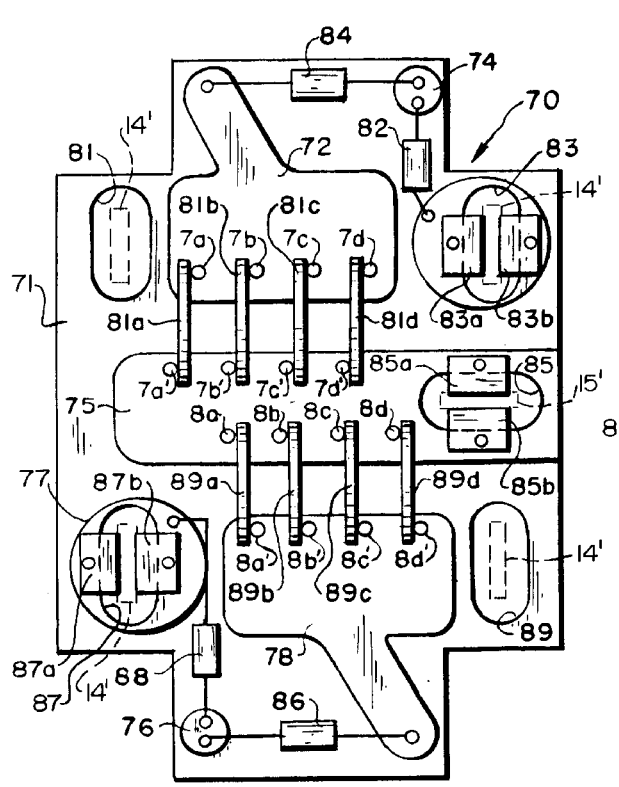
FIG. 8 is a schematic front elevation of a second embodiment of circuit board means of this invention with varistors in place.
Figure 9:
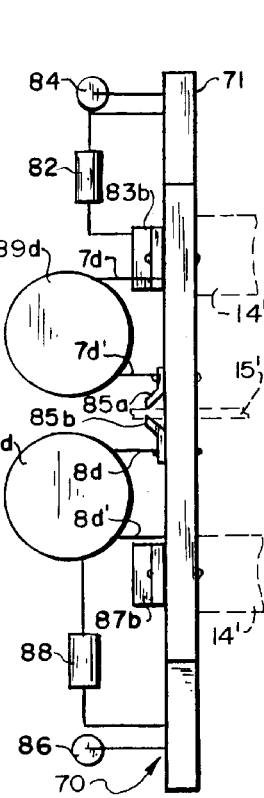
FIG. 9 is a side elevation of the circuit board means of FIG. 8 with varistors upstanding therefrom in lollipop fashion.

FIGS. 8 and 9 show a second embodiment, 70, of circuit board means of this invention face-on and from the side, respectively, each with varistors in place. This embodiment (70) of circuit board means mounts the varistors upstanding on a pair of leads in "lollipop" fashion, contrasting with the surface-mounting method of the previous embodiment. Parts corresponding in structure or function are identified with reference numerals higher by 20 than in the previous embodiment, so it is unnecessary to identify all the parts by name or number where such correspondence is readily noted. The description concentrates upon identification of unlike parts and avoids needless repetition in description of like parts.

In FIG. 8, upper surface 72 and lower surface 78 have rectangular bodies with similarly angled stems, instead of being keyhole-shaped like corresponding laminar surfaces 52 and 58 on the previous board. Central surface 75 here covers more of the width of board 71 than corresponding surface 55 did on previous board 51. An upper array of four varistors (81a, 81b, 81c, 81d) and a lower array of four varistors (89a, 89b, 89c, 89d) replace individual varistors 61 and 69 of the previous embodiment. Leads 7a, 7b, 7c, 7d from the upper surface 72 and leads 7a', 7b', 7c', 7d' from the central surface support the upper array of varistors; while leads 8a, 8b, 8c, 8d from the central surface and leads 8a', 8b', 8c', 8d' from the lower surface support the lower array of varistors.

As is evident, the four varistors in each such array in FIG. 8 are connected in electrical parallel circuit with one another, the respective arrays having different phases of input electrical power. In use, board 70 receives blades 14' (dashed lines) from adapter 20 through each of openings 81, 83, 87, 89, and pairs of flexible contacts 83a, 83b and 87a, 87b are energized by contact with such intruding blades energized from a power source, whereas optionally blade 15' connects through opening 85 to pair of flexible contacts 85a, 85b as for grounding purposes.

Figure 10:
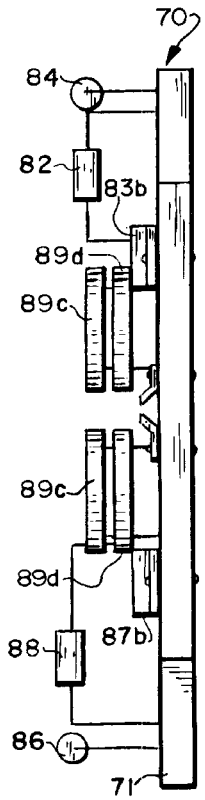
FIG. 10 is a side elevation of the circuit board means of FIG. 9, with varistor leads bent to parallel the varistors to the board.

FIG. 10 shows from the side further modified embodiment 70' wherein the upstanding wire mounts for the FIG. 8 varistors have been bent down to reorient the varistors parallel to the board and thus conserve space rather than left upstanding as in FIG. 9. Here no attempt is made to indicate the conductive blades as already done in FIG. 9, which is similar except for the varistor reorientation.

The operation of the surge-protection apparatus of the present invention is readily understood, regardless of specific embodiments, which considered together form a family of surge-protection devices. Similarities are noted, as are their common advantages, and differences are also mentioned along with their respective benefits. Persons skilled in the art of surge protection, especially in relation to transient electrical surges received from power lines, will be able to weigh the various advantages and benefits and then select whatever combination of features best meets the prevailing needs.

A first decision point is whether to employ a meter adapter within which to house the electrical and associated mechanical components of the surge-protection apparatus—or not. The answer may depend upon an assessment of the degree of care likely to be exercised by installers, foreseen frequency of installation or removal, whether the customer or the utility is paying for the apparatus, and whether the utility is profiting from installation as a service. If the extra cost of an adapter housing is to be avoided, the existing meter can be unplugged, the circuit board means slipped over the protruding blades of the meter, and the meter be plugged in again, with care taken to see that the external ground connection is intact —all in less than five minutes.

In the first embodiment a single varistor is thereby interposed between each power phase and ground. By its non-linear relationship of resistance to applied voltage, a varistor is substantially nonconductive at ordinary electrical power voltage but conducts readily at surge voltages and disproportionately more as the voltage rises. Hence, a surge from lightning or other transient source—which may occasion currents of thousands or tens of thousands of amperes over very short periods—will be shunted to ground through the varistors.

A conventional current-limiting fuse will not respond to such brief current flows, but will open the circuit upon the occurrence of a sustained over-voltage. Each transient surge results in dissipation of energy in the apparatus especially in the varistors, heating them, and too frequent surges may heat the varistors to their characteristic failure temperature, in which event they may fail explosively and/or burn uncontrollably. The temperature-sensitive cutoff means senses the varistor temperature and is adapted to open the circuit at a temperature safely below the characteristic failure temperature. For similar use of such cutoff means, see my first listed patent (background).

In the first embodiment (FIGS. 6 and 7) the voltage received at flexible contacts 63a, 63b from an intruding meter blade appears also at surrounding conductive surface layer portion 53 to which the flexible contacts are fastened and successively at temperature-sensitive thermal cutoff means 62 and current-limiting fuse 64 connected in series to keyhole-shaped conductive surface layer portion 52, against which one face of varistor 61 is assembled. If that voltage is not at or above a level at which the varistor conducts appreciably, flow of current therethrough is slight, and no great amount of energy is dissipated or diverted thereby.

Whenever a surge to higher voltages appears at the varistor the excess gets clipped off as current flows through it to ground plate 40 in contact with a major part or substantially all of the opposite side of the varistor, and from there to an external ground (not shown) connected thereto, as via a blade in contact with flexible contacts 65a, 65b on conductive surface portion 55 at fifth blade-receptive opening 65, or otherwise (not shown). At the corner diametrically across from the first blade-receiving location, flexible contacts 67a, 67b on surface portion 57 conduct via intervening temperature-sensitive cutoff means 68 through current-limiting fuse 66 to one face of varistor 69 retained against conductive surface layer portion 58.

In the event of a sustained over-voltage one or another (if not both) of the current-limiting fuses (64, 66) will melt and open the circuit, removing the voltage from its varistor and removing such surge-protection from any downstream electrical equipment on-load at the time. In the event of frequent but brief surges from lightning or other transient source, the varistor(s) become(s) hotter and—if the temperature reaches a predetermined cutoff temperature—one or the other (if not both) of the thermal cutoff means opens the circuit to prevent the temperature from reaching the characteristic varistor failure temperature.

The second embodiment (FIGS. 8, 9, 10) operates much like the first but with modified conductive contact surface layer portions, all still on a single side of the otherwise very similar board, and with lollipop mounting of the varistors, in place of the sandwich method of the first embodiment. Each varistor (as available from Harris, Panasonic, or Siemens, for example) stands above the board on two insulated wire legs in contact with respective faces of the supported varistor. Plural varistors may be so mounted in parallel circuit, such as the four shown here for each input phase, increasing the current-carrying capacity substantially. To conserve space, the upstanding wire mounts are preferably bent to parallel the varistors to the board, such as two to one side and two to the other side from the respective two arrays of varistors here, as in FIG. 10. Such compactness is optional with adapter housings, but may be necessary for the disclosed adapterless installation.

It will be understood that in the TVSS method of this invention the varistors are enabled to clip transient voltage surges and to conduct resulting surge currents to ground without intervention of any other type of resistive impedance whose conductive receptivity increases with increasing voltage. In the practice of the invention the varistors clip the surges unassisted. Electrical arcing means has been excluded as an artifact of the prior art proven ineffective to cope with the problem even with the addition of series varistors. This TVSS means is located between but apart from the watt-hour meter housing and its socket located in a utility box or panel, and preferably supported on blade-like terminals protruding from the meter or from an interposed adapter housing laterally enclosing the TVSS means and also having jaws into which the meter terminals plug.

Advantages and benefits of this invention have been mentioned and are readily apparent. Added features may be employed, such as in-line fusing or circuit interrupting actuated by different means. Preferred embodiments and variants have been suggested for this invention, but other modifications may be made, as by adding, combining, deleting, or subdividing compositions, parts, or steps, while retaining some of the advantages and benefits of the present invention—which itself is defined in the following claims.

The claimed invention:

1. Transient voltage surge suppression (TVSS) method operative in the vicinity of an external ground and a watt-hour meter having a housing with blade-like terminals protruding therefrom and adapted to connect via conductive socket laws in an otherwise grounded utility box or panel to a source of electrica power subject to transient voltage surges, comprising providing TVSS means substantially non-conductive at usual power voltage but conductive at higher voltages including varistors as the sole components thereof adapted to clip transient voltage surges and to shunt surge currents to ground, interposing the TVSS means removably between the meter housing and the conductive socket jaws of the utility box or panel, and engaging the socket jaws disengageably with blade-like terminals protruding thereinto from contact with the TVSS means. including supporting the TVSS means at least partially upon the blade-like terminals, and enclosing the TVSS means, so supported, laterally within the utility box or panel.

2. TVSS method according to claim 1, wherein the blade-like terminals are the blade-like terminals protruding from the meter housing, and including the step of supporting the TVSS means substantially entirely upon the blade-like terminals.

3. Transient voltage surge suppression (TVSS) apparatus adapted to protect a watt-hour meter and electrical equipment metered thereby from lightning or switching transient voltage surges, comprising a circuit board (i) carrying means substantially non-conductive at normal power voltage but conductive at higher voltages, including varistors as the sole variable resistance components thereof adapted to clip transient voltage surges and shunt surge currents to ground, (ii) being adapted to fit around the blade-like terminals normally protruding from a watt-hour meter into jaws of a powered socket within an electrical utility box or panel, and (iii) further adapted to be supported at least in part by contact with whatever blade-like terminals may engage the jaws of the socket.

4. TVSS apparatus according to claim 3, in combination with blade-like terminals engaging the jaws of the socket, and supported substantially entirely by those terminals.

5. TVSS apparatus according to claim 3, in combination with a utility box or panel having a cover adapted to fit over the front of the box or panel and around a watt-hour meter and thereby to cover the box or panel insofar as not coverable by the meter, the TVSS circuit board and the varistors and other circuit components carried thereby being located substantially entirely within the box or panel.

6. TVSS apparatus according to claim 3, wherein the varistors are disklike, with two faces, and are surface-mounted with one face contiguous with a conductive surface on the board and with the other face contiguous with a ground plate component.

7. TVSS apparatus according to claim 3, wherein the varistors are mounted in lollipop fashion from the circuit board—each on two flexible stems, one powered and one grounded.

8. TVSS apparatus according to claim 3, wherein the varistors are mounted on two flexible stems, one powered and one grounded, but bent to orient the varistors substantially parallel to the board.

9. Method of transient voltage surge suppression, comprising providing transient voltage surge suppression (TVSS) circuit board means with sidewise flexing contactors adapted to contact protruding plug-in terminals of a watt-hour meter;

interposing the TVSS circuit board means between a watt-hour meter with a housing and protruding plug-in terminals, and a utility box or panel with jaws into which the protruding watt-hour meter terminals are adapted to plug, through an opening in the utility box or panel coverable by a watt-hour meter housing;

contacting the protruding terminals of the watt-hour meter with the sidewise flexing contactors of the TVSS circuit board means, and plugging the protruding terminals into the utility box or panel jaws, and covering the utility box or panel opening with the meter housing, and thereby enclosing the TVSS circuit board means.

10. In combination, transient voltage surge suppression (TVSS) circuit board means with sidewise flexing contactors, a watt-hour meter with a housing and protruding terminals, and a utility box or panel having jaws into which protruding watt-hour terminals are adapted to plug through an opening coverable by the meter housing, the circuit board means being provided with TVSS circuitry connected to the contactors, the circuit board means being distinct from and interposable between the watt-hour meter with protruding terminals plugged into the jaws of the utility box or panel; and the sidewise flexing contactors being in electrical contact with the protruding terminals of the watt-hour meter, the utility box or panel opening being covered by the meter housing, and the TVSS board means being enclosed, with the watt-hour meter terminals plugged into the jaws in the utility box or panel.

* * * * *